United States Patent [19]

Himeno

[11] Patent Number: 5,400,271
[45] Date of Patent: Mar. 21, 1995

[54] APPARATUS FOR AND METHOD OF CALCULATING SUM OF PRODUCTS

[75] Inventor: Takuji Himeno, Chiba, Japan

[73] Assignee: Sony Corporation, Tokyo, Japan

[21] Appl. No.: 985,028

[22] Filed: Dec. 3, 1992

[30] Foreign Application Priority Data

Dec. 5, 1991 [JP] Japan .................................. 3-348942

[51] Int. Cl.[6] ............................ G06F 7/00; G06F 7/38
[52] U.S. Cl. .................................. 364/750.5; 364/748
[58] Field of Search ................. 364/750.5, 748, 724.16

[56] References Cited

U.S. PATENT DOCUMENTS

| | | | |
|---|---|---|---|
| 4,931,980 | 6/1990 | Rault | 364/750.5 |
| 5,032,865 | 7/1991 | Schlunt | 364/750.5 |
| 5,185,713 | 2/1993 | Kobunaya | 364/750.5 |
| 5,235,538 | 8/1993 | Sumi et al. | 364/750.5 |

*Primary Examiner*—Tan V. Mai
*Attorney, Agent, or Firm*—Charles P. Sammut

[57] ABSTRACT

An apparatus for and a method of calculating a sum of products by which calculation of a sum of products can be performed with a high degree of accuracy. The apparatus includes a data memory for storing data therein, a coefficient memory for storing coefficients therein, and a cumulative adder including a multiplier, a cumulative adder and an accumulator for calculating the products of the data stored in the data memory and the coefficients stored in the coefficient memory in order of magnitude of the exponent parts of the coefficients stored in the coefficient memory and for cumulatively adding the products.

12 Claims, 11 Drawing Sheets

FIG. 3

| ADDRESS OF MEMORY 5 | COEFFICIENT (MANTISSA PART IN BINARY NOTATION) | MANTISSA PART OF COEFFICIENT (BINARY NOTATION) | EXPONENT PART OF COEFFICIENT | DIFFERENCE BETWEEN EXPONENT PARTS |
|---|---|---|---|---|
| 00 | $C_1 = 01010001 \times 2^{-7}$ | 01010001 | $-7$ | 0 |
| 01 | $C_3 = 11001100 \times 2^{-8}$ | 11001100 | $-8$ | 1 |
| 02 | $C_5 = 00111001 \times 2^{-9}$ | 00111001 | $-9$ | 1 |
| 03 | $C_7 = 10110011 \times 2^{-10}$ | 10110011 | $-10$ | 1 |
| 04 | $C_9 = 01101000 \times 2^{-11}$ | 01101000 | $-11$ | 1 |
| 05 | $C_{11} = 10111000 \times 2^{-11}$ | 10111000 | $-11$ | 0 |
| 06 | $C_{13} = 01100000 \times 2^{-12}$ | 01100000 | $-12$ | 1 |
| 07 | $C_{15} = 10111111 \times 2^{-12}$ | 10111111 | $-12$ | 0 |
| 08 | $C_{17} = 01010001 \times 2^{-13}$ | 01010001 | $-13$ | 1 |
| 09 | $C_{19} = 10111101 \times 2^{-13}$ | 10111110 | $-13$ | 0 |

FIG. 4

| OUTPUT OF DOWN COUNTER 10 | | OUTPUT OF XOR CIRCUIT 11 | | DATA READ OUT FROM DATA MEMORY 1 |
|---|---|---|---|---|
| (HEXA-DECIMAL NOTATION) | (BINARY NOTATION) | (BINARY NOTATION) | (DECIMAL NOTATION) | |
| 14 | 1010 0 | 0 1010 | 10 | |
| 13 | 1001 1 | 1 0110 | -10 | D-19 |
| 12 | 1001 0 | 0 1001 | 9 | D19 |
| 11 | 1000 1 | 1 0111 | -9 | D-17 |
| 10 | 1000 0 | 0 1000 | 8 | D17 |
| F | 0111 1 | 1 1000 | -8 | D-15 |
| E | 0111 0 | 0 0111 | 7 | D15 |
| D | 0110 1 | 1 1001 | -7 | D-13 |
| C | 0110 0 | 0 0110 | 6 | D13 |
| B | 0101 1 | 1 1010 | -6 | D-11 |
| A | 0101 0 | 0 0101 | 5 | D11 |
| 9 | 0100 1 | 1 1011 | -5 | D-9 |
| 8 | 0100 0 | 0 0100 | 4 | D9 |
| 7 | 0011 1 | 1 1100 | -4 | D-7 |
| 6 | 0011 0 | 0 0011 | 3 | D7 |
| 5 | 0010 1 | 1 1101 | -3 | D-5 |
| 4 | 0010 0 | 0 0010 | 2 | D5 |
| 3 | 0001 1 | 1 1110 | -2 | D-3 |
| 2 | 0001 0 | 0 0001 | 1 | D3 |
| 1 | 0000 1 | 1 1111 | -1 | D-1 |
| 0 | 0000 0 | 0 0000 | 0 | D1 |

FIG. 6

| ADDRESS OF MEMORY 5 | COEFFICIENT (MANTISSA PART IN BINARY NOTATION) | MANTISSA PART OF COEFFICIENT (BINARY NOTATION) | EXPONENT PART OF COEFFICIENT | DIFFERENCE BETWEEN EXPONENT PARTS |
|---|---|---|---|---|
| 00 | $C_1 = 01010001 \times 2^{-7}$ | 01010001 | $-7$ | |
| 01 | $C_3 = 11001100 \times 2^{-8}$ | 11001100 | $-8$ | 1 |
| 02 | $C_5 = 00111001 \times 2^{-9}$ | 00111001 | $-9$ | 1 |
| 03 | $C_7 = 10110011 \times 2^{-10}$ | 10110011 | $-10$ | 1 |
| 04 | $C_9 = 01101000 \times 2^{-11}$ | 01101000 | $-11$ | 1 |
| 05 | $C_{11} = 10111000 \times 2^{-11}$ | 10111000 | $-11$ | 0 |
| 06 | $C_{13} = 01100000 \times 2^{-12}$ | 01100000 | $-12$ | 1 |
| 07 | $C_{15} = 10111111 \times 2^{-12}$ | 10111111 | $-12$ | 0 |
| 08 | $C_{17} = 01010001 \times 2^{-13}$ | 01010001 | $-13$ | 1 |
| 09 | $C_{19} = 10111110 \times 2^{-13}$ | 10111110 | $-13$ | 0 |

FIG. 7

| NO. | COEFFICIENT | | COEFFICIENT ADJUSTED FOR MONOTONOUS INCREASE | |
|---|---|---|---|---|
| | EXPONENT PART | MANTISSA PART | EXPONENT PART | MANTISSA PART |
| $C_{20}$ | -8 | 71 | -8 | 71 |
| $C_{19}$ | -10 | 98 | -8 | 25 |
| $C_{18}$ | -7 | -98 | -7 | -98 |
| $C_{17}$ | -6 | -88 | -6 | -88 |
| $C_{16}$ | -7 | -70 | -6 | -35 |
| $C_{15}$ | -6 | 101 | -6 | 101 |
| $C_{14}$ | -5 | 97 | -5 | 97 |
| $C_{13}$ | -6 | 101 | -5 | 50 |
| $C_{12}$ | -5 | -78 | -5 | -78 |
| $C_{11}$ | -4 | -89 | -4 | -89 |
| $C_{10}$ | -5 | -117 | -4 | -58 |
| $C_{9}$ | -5 | 107 | -4 | 54 |
| $C_{8}$ | -3 | 78 | -3 | 78 |
| $C_{7}$ | -3 | 65 | -3 | 65 |
| $C_{6}$ | -4 | -68 | -3 | -34 |
| $C_{5}$ | -2 | -75 | -2 | -75 |
| $C_{4}$ | -2 | -78 | -2 | -78 |
| $C_{3}$ | -4 | 83 | -2 | -21 |
| $C_{2}$ | -1 | 105 | -1 | 105 |
| $C_{1}$ | 0 | 103 | 0 | 103 |

FIG. 8

| NO. | COEFFICIENT | | ORDER OF CALCULATION |
|---|---|---|---|
| | EXPONENT PART | MANTISSA PART | |
| $C_{20}$ | −8 | 71 | 2 |
| $C_{19}$ | −10 | 98 | 1 |
| $C_{18}$ | −7 | −98 | 3 |
| $C_{17}$ | −6 | −88 | 5 |
| $C_{16}$ | −7 | −70 | 4 |
| $C_{15}$ | −6 | 101 | 6 |
| $C_{14}$ | −5 | 97 | 8 |
| $C_{13}$ | −6 | 101 | 7 |
| $C_{12}$ | −5 | −78 | 9 |
| $C_{11}$ | −4 | −89 | 12 |
| $C_{10}$ | −5 | −117 | 10 |
| $C_9$ | −5 | 107 | 11 |
| $C_8$ | −3 | 78 | 15 |
| $C_7$ | −3 | 65 | 16 |
| $C_6$ | −4 | −68 | 13 |
| $C_5$ | −2 | −75 | 17 |
| $C_4$ | −2 | −78 | 18 |
| $C_3$ | −4 | 83 | 14 |
| $C_2$ | −1 | 105 | 19 |
| $C_1$ | 0 | 103 | 20 |

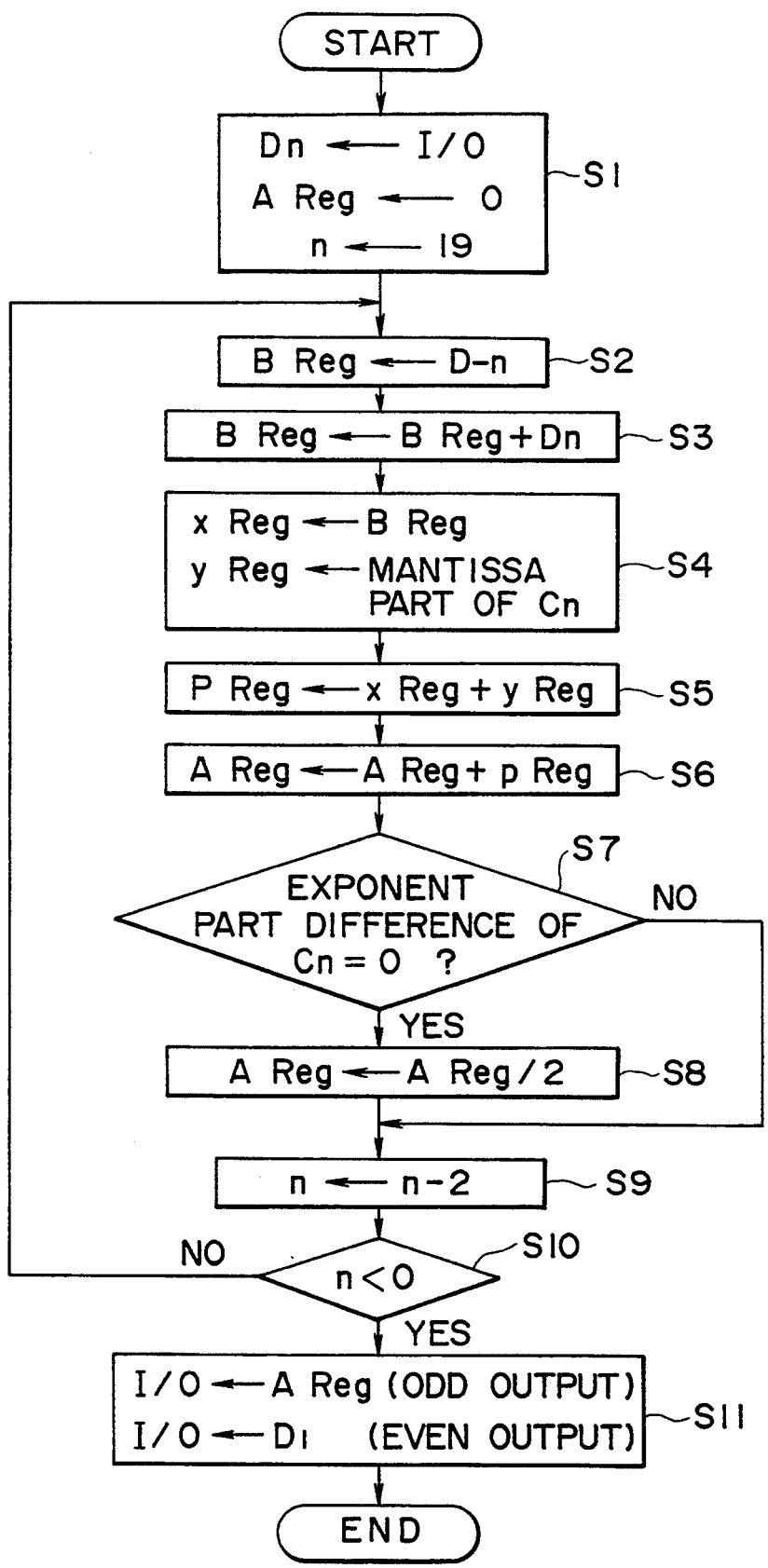

APPARATUS FOR AND METHOD OF CALCULATING SUM OF PRODUCTS

BACKGROUND OF THE INVENTION

1. Field of the Invention

This invention relates to an apparatus for and a method of calculating a sum of products.

2. Description of the Related Art

In a digital filter of, for example, order p, products of p input data and p predetermined coefficients are successively added cumulatively. In other words, a sum of products of the p data and the p predetermined coefficients is calculated so that a desired filter output is outputted from the digital filter of order p.

In a conventional digital filter, when coefficients for calculation of a sum of products of data are processed in a fixed-point form, the accuracy of the coefficients is limited by a word length (bit number) handled in the apparatus. Accordingly, there is a subject that a round-off error takes place and consequently a desired filter output cannot be obtained.

It is one of possible solutions to the subject to increase the number of bits Which can be handled by the apparatus in order to reduce round-off errors. However, the solution still has a subject that the number of elements constituting the apparatus is increased and the power dissipation of the apparatus is increased.

Further, in a digital filter designed, for example, as a low-pass filter, since the absolute values of coefficients which are symmetrical with respect to a coefficient of order 0 generally decrease as the order number increases, when the number of bits which can be handled by the apparatus is increased, high order bits are not used with those coefficients which are high in order number, that is, those coefficients which are small in absolute value. Accordingly, the efficiency is low.

There is a method wherein coefficients are handled separately for an exponent part and a mantissa part, that is, in the floating point form. However, when products (products of data and coefficient) having comparatively small exponent parts are to be added cumulatively to products having comparatively large exponent parts, since the method truncates low bits of mantissa parts of the products having comparatively small exponent parts in order to make the sizes of the exponent parts of all of the products equal to one another, that is, to adjust the number of columns, it has a subject that it involves a number of round-off errors.

SUMMARY OF THE INVENTION

It is an object of the present invention to provide an apparatus for and a method of calculating a sum of products by which calculation of a sum of products can be performed with a high degree of accuracy.

In order to attain the object, according to an aspect of the present invention, there is provided an apparatus for calculating a sum of products, which comprises data storage means for storing data therein, coefficient storage means for storing coefficients therein, and cumulative adding means for calculating the products of the data stored in the data storage means and the coefficients stored in the coefficient storage means in order of magnitude of the exponent parts of the coefficients stored in the coefficient storage means and for cumulatively adding the products.

With the apparatus, data are stored into the storage means while coefficients are stored into the coefficient storage means. Then, the products of the data stored in the data storage means and the coefficients stored in the coefficient storage means are calculated in order of magnitude of the exponent parts of the coefficients stored in the coefficient storage means and then the products are added cumulatively by the cumulative adding means. Accordingly, even when the coefficients include, in a mixed condition, those coefficients which have large exponent parts and those coefficients which have small exponent parts, calculation of a sum of products can be achieved with a high degree of accuracy.

The cumulative adding means may calculate the products of the data stored in the data storage means and the coefficients stored in the coefficient storage means in reverse order of magnitude of the exponent parts of the coefficients stored in the coefficient storage means and cumulatively add the products. Thus, round-off errors which take place with coefficients having small exponent parts, that is, having small absolute values, can be reduced.

Preferably, the apparatus for calculating a sum of products further comprises coefficient read-out means for reading out the coefficients stored in the coefficient storage means in reverse order of the exponent parts of the coefficients. Since cumulative addition is thus performed in reverse order of magnitude of the exponent parts of the coefficients, round-off errors which take place with coefficients having small exponent parts, that is, having small absolute values, can be reduced.

Preferably, the apparatus for calculating a sum of products further comprises data read-out means for reading out the data stored in the data storage means in the order corresponding to the order in which the coefficients stored in the coefficient storage means are read out by the coefficient read-out means. Thus, cumulative addition of the products of desired coefficients and data can be performed.

The cumulative adding means may calculate the products of the data stored in the data storage means and the coefficients stored in the coefficient storage means in the order in which the exponent parts of the coefficients stored in the coefficient storage means increase monotonously and cumulatively add the products. Since the products of the coefficients and the data are cumulatively added substantially in the order in which the absolute value of the coefficient increases, cancelling of a coefficient having a small absolute value is prevented.

The cumulative adding means may calculate the products of the data stored in the data storage means and the coefficients stored in the coefficient storage means in the order in which the differences between adjacent ones of the exponent parts of the coefficients stored in the coefficient storage means exhibit the value of either 0 or 1 and cumulatively add the products. Since the products of the coefficients and the data are cumulatively added in the order in which the absolute values of the coefficients do not vary by a great amount, cancelling of a coefficient having a small absolute value is prevented.

The cumulative adding means may develop the coefficients stored in the coefficient storage means into the form of sums having an arbitrary number of terms in accordance with the magnitudes of the exponent parts of the coefficients, calculate the products of the sums and the data stored in the data storage means and cumulatively add the products. Since the absolute values of the coefficients developed into the form of sums are small and the difference between the maximum value and the minimum value of the absolute values of the coefficients is small, cancelling of a coefficient is prevented.

Preferably, the apparatus for calculating a sum of products further comprises bit shifting means for bit shifting the products cumulatively added by the cumulative adding means in accordance with the differences between the exponent parts of the coefficients stored in the coefficient storage means. Thus, the products calculated from the coefficients which are different in value of the exponent parts can be adjusted in column.

The coefficient storage means may store the differences between the exponent parts of the coefficients therein. The storage capacity of the coefficient storage means can be reduced comparing with the case wherein the exponent parts of the coefficients are stored in the coefficient storage means.

According to another aspect of the present invention, there is provided a method of calculating a sum of products, which comprises the steps of storing data, storing coefficients, and calculating the products between the data and the coefficients in order of magnitude of the exponent parts of the coefficients and cumulatively adding the products.

In the method, data are stored first and then coefficients are stored, whereafter the products of the data and the coefficients are calculated in order of magnitude of the exponent parts of the coefficients and then are cumulatively added. Accordingly, with the method, even when coefficients having large exponent parts and coefficients having small exponent parts are mixed in the coefficients, cumulative addition can be performed with a high degree of accuracy.

According to a further aspect of the present invention, there is provided an apparatus for calculating a sum of products, which comprises storage means for storing data therein, multiplying means for calculating the products of the data stored in the storage means and the mantissa parts of coefficients, cumulative adding means for cumulatively adding the products calculated by the multiplying means, and bit shifting means for bit shifting the products cumulatively added by the cumulative adding means in accordance with the differences between the exponent parts of the coefficients.

In the apparatus, data are stored into the storage means, and the products of the stored data and mantissa parts of coefficients, which may be represented in the floating point form, are calculated by the multiplying means. The products thus calculated are added cumulatively and then bit shifted in accordance with the differences between the exponent parts of the coefficients. Accordingly, with the apparatus, cancelling when the products calculated from the coefficients which are different in value of the exponent parts are to be adjusted in column can be minimized.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 3 is a table showing the mantissa parts of coefficients and differences between exponent parts of the coefficients stored in a coefficient memory of the low-pass filter of FIG. 1;

FIG. 4 is a table illustrating a relationship between the input value and the output value of an exclusive OR circuit of the low-pass filter of FIG. 1;

FIG. 6 is a table showing the mantissa parts of coefficients and differences between the exponent parts of the coefficients stored in the coefficient memory shown in FIG. 1;

FIG. 7 is a table illustrating adjustment of the mantissa parts of coefficients so that the exponent parts of the coefficients may increase monotonously;

FIG. 8 is a table illustrating calculation of a sum of products of data and coefficients in reverse order of magnitude of the exponent parts of the coefficients;

FIG. 11 is a flow chart illustrating operation of the digital low-pass filter of FIG. 10.

DESCRIPTION OF THE PREFERRED EMBODIMENTS

Figure 1:
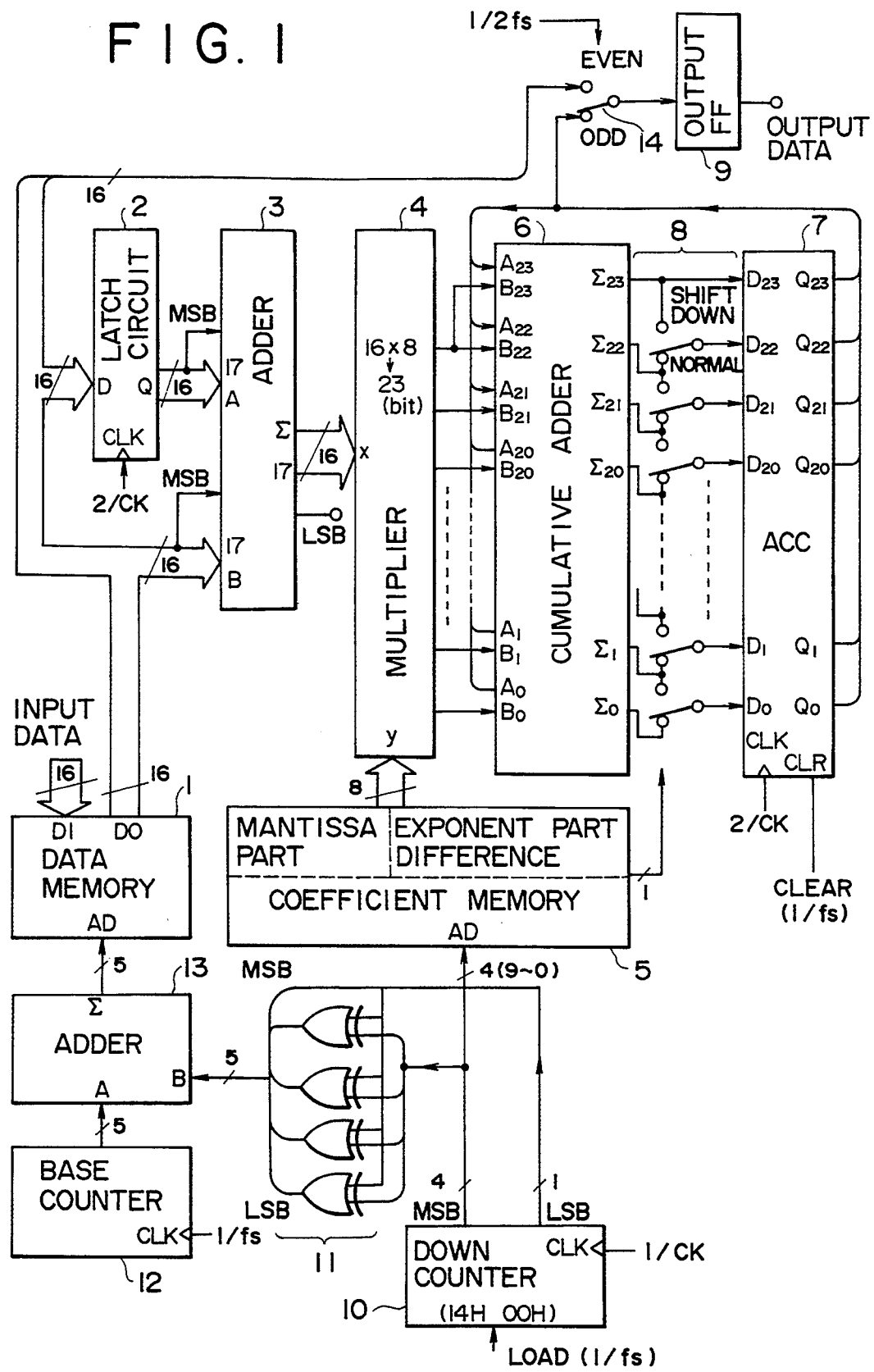
FIG. 1 is a block diagram of a digital low-pass filter to which an apparatus for calculating a sum of products according to the present invention is applied showing a first preferred embodiment of the present invention.

Referring first to FIG. 1, there is shown a digital low-pass filter (LPF) to which an apparatus for calculating a sum of products according to the present invention is applied. The digital low-pass filter shown includes a data memory 1 into which input data of, for example, 16 bits inputted from an input terminal DI thereof are stored. The data memory 1 receives an address signal at an address terminal AD thereof and outputs data stored at an address designated by the address signal by way of an output terminal DO thereof to a latch circuit 2, an adder 3 and a switch 14. The latch circuit 2 receives, at a clock terminal CLK thereof, a clock signal having a period of 2/CK equal to twice a period of 1/CK (frequency CK) in which data are read out from the data memory 1, at a timing 16-bit data read out from the data memory 1 at a timing at which the clock signal is inputted. The latch circuit 2 outputs the thus latched 16-bit data to an input terminal A of the adder 3. In other words, the latch circuit 2 latches every other one of data read out from the data memory 1 and supplies the latched data to the adder 3.

The adder 3 extends most significant bits (MSBs) of 16-bit data outputted from the latch circuit 2 and 16-bit data outputted from the data memory 1 each by one bit and copies the most significant bits, that is, the sign bits, of data outputted from the latch circuit 2 and data outputted from the data memory 1 each to the thus extended one bit, thereby providing a countermeasure for an overflow which may be caused by addition of data. The adder 3 truncates the least significant bit (LSB) of each 17-bit data obtained by the addition and outputs the upper 16 bits to a multiplier 4.

A coefficient memory 5 stores in advance therein coefficients $C_n$ (n is a natural number) of the digital low-pass filter, for example, separately for the mantissa parts of 8 bits and differences between the exponent parts of the coefficients $C_n$ and the exponent parts of the coefficients $C_{n-1}$ of preceding order. The coefficient memory 5 receives an output of a down counter 10 at an address terminal AD thereof and supplies the mantissa part of a coefficient $C_n$ and the corresponding index part difference stored at an address thereof designated by the output of the down counter 10 to the multiplier 4 and a shifter 8. It is to be noted that, in the present digital low-pass filter, the mantissa parts of the coefficients stored in the coefficient memory 5 are adjusted so that the difference between the exponent parts of each adjacent coefficients may consist of one bit, that is, the difference may be either 0 or 1.

Figure 2:
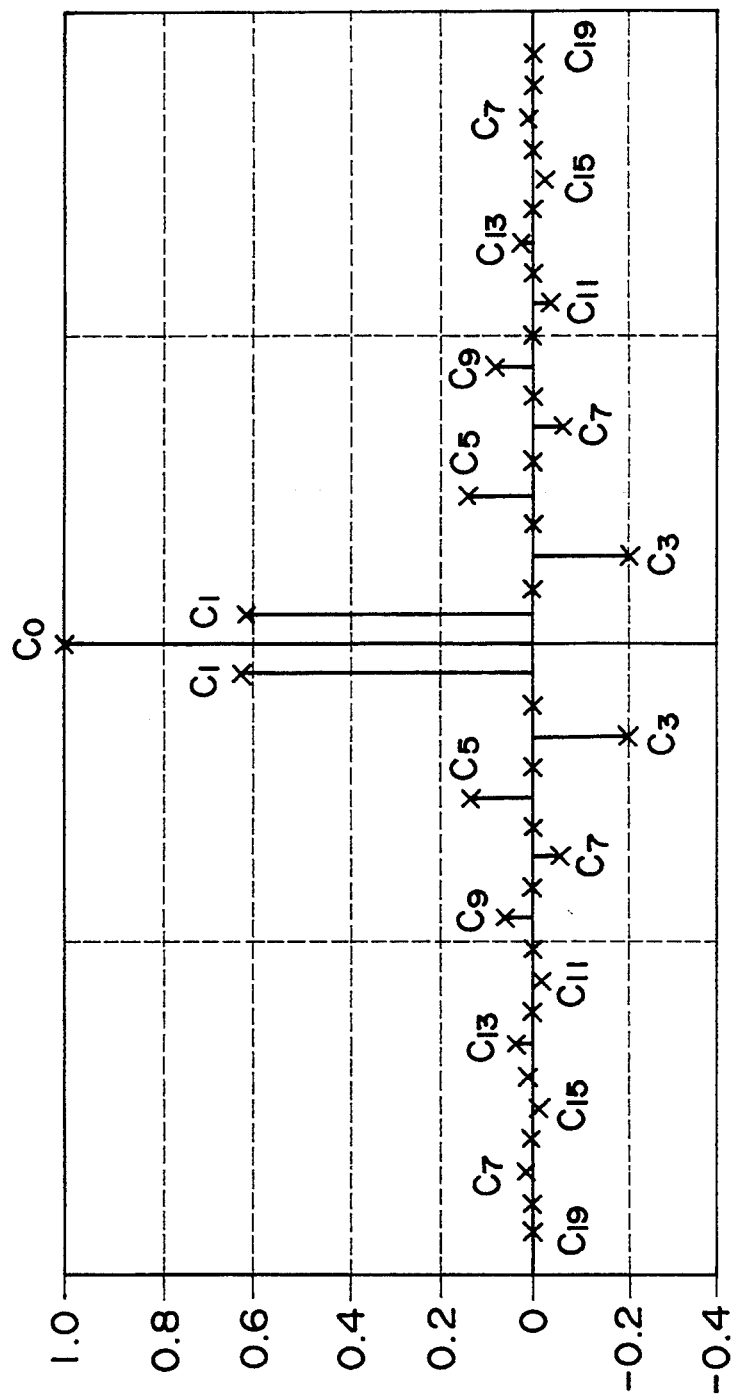
FIG. 2 is a diagram showing an impulse response of the digital low-pass filter of FIG. 1.

Here, the digital low-pass filter is in the form of a digital filter of the interpolation type of order 39 which twofold oversamples an input digital signal to produce a filter output. The digital low-pass filter is designed so that the impulse response thereof presents such a waveform as shown in FIG. 2. As can be seen from the impulse response shown in FIG. 2, the coefficients of the low-pass filter have a tendency that the absolute values thereof decrease as the order number increases, and are symmetrical with respect to the coefficient Co of order 0 and are of the interpolation type. Accordingly, the coefficients $C_2$, $C_4$, $C_6$, $C_8$, $C_{10}$, $C_{12}$, $C_{14}$, $C_{16}$ and $C_{18}$ of even-numbered order except the coefficient $C_0$ (=1) of order 0 are all equal to zero. Further, the coefficients of odd-numbered order are such as follows:

$C_1 = 0.6328$
$C_3 = -0.2031$
$C_5 = 0.1152$
$C_7 = -0.07520$
$C_9 = 0.05078$
$C_{11} = -0.03516$
$C_{13} = 0.02393$
$C_{15} = -0.01587$
$C_{17} = 0.009888$
$C_{19} = -0.008057$

In this manner, in the present digital low-pass filter, since the coefficients $C_2$ to $C_{18}$ ($C_2$, $C_4$, $C_6$, $C_8$, $C_{10}$, $C_{12}$, $C_{14}$, $C_{16}$ and $C_{18}$) of even-numbered order except order 0 are equal to zero, the difference between each adjacent coefficients $C_1$ to $C_{19}$ ($C_1$, $C_3$, $C_5$, $C_7$, $C_9$, $C_{11}$, $C_{13}$, $C_{15}$, $C_{17}$ and $C_{19}$) of odd-numbered order except the coefficients $C_2$ to $C_{18}$ of even-numbered order, that is, the difference between the exponent parts of the coefficients $C_{2q+1}$ and $C_{2q-1}$, is used as a difference between the exponent parts of each adjacent coefficients. Accordingly, the exponent part difference of the coefficient $C_{2q+1}$ is defined as a difference between the exponent parts of the coefficients $C_{2q+1}$ and $C_{2q-1}$. Here, q is a natural number.

The coefficients $C_1$ to $C_{19}$ of odd-numbered order can be represented in the following manner in the form of a floating point form wherein the mantissa part thereof includes 8 bits and the exponent part difference is either 0 or 1:

$C_1 = 01010001 \times 2^{-7}$
$C_3 = 11001100 \times 2^{-8}$
$C_5 = 00111011 \times 2^{-9}$
$C_7 = 10110011 \times 2^{-10}$
$C_9 = 01101000 \times 2^{-11}$
$C_{11} = 10111000 \times 2^{-11}$
$C_{13} = 01100010 \times 2^{-12}$
$C_{15} = 10111111 \times 2^{-12}$
$C_{17} = 01010001 \times 2^{-13}$
$C_{19} = 10111110 \times 2^{-13}$ The coefficients $C_1$ to $C_{19}$, the mantissa parts of which are adjusted such that the difference between the exponent parts of the coefficients $C_1$ and $C_3$ is 1; the difference between the exponent parts of the coefficients $C_3$ and $C_5$ is 1; the difference between the exponent parts of the coefficients $C_5$ and $C_7$ is 1; the difference between the exponent parts of the coefficients $C_7$ and $C_9$ is 1; the difference between the exponent parts of the coefficients $C_9$ and $C_{11}$ is 0; the difference between the exponent parts of the coefficients $C_{11}$ and $C_{13}$ is 1; the difference between the exponent parts of the coefficients $C_{13}$ and $C_{15}$ is 0; the difference between the exponent parts of the coefficients $C_{15}$ and $C_{17}$ is 1; and the difference between the exponent parts of the coefficients $C_{17}$ and $C_{19}$ is 0 in this manner, are stored in advance in the coefficient memory 5, for example, starting at address 0 as seen in FIG. 3. In the present low-pass filter, however, since the position of the decimal point of the coefficient $C_1$ stored at address 0 of the coefficient memory 5 is treated as a reference decimal point position, the exponent part difference of the coefficient $C_1$ is stored as "0" in the coefficient memory 5.

The multiplier 4 calculates the product of 16-bit data outputted from the adder 3 and the 8-bit mantissa part of a coefficient $C_n$ stored in the coefficient memory 5 and outputs a result of the calculation of 23 bits. Here, since each of the most significant bits of the 16-bit data outputted from the adder 3 and the 8-bit mantissa part of the coefficient $C_n$ stored in the coefficient memory 5 is a sign bit, the product thus calculate does not include 24 bits (=16 bits×8 bits) but includes 23 bits (=15 bits×7 bits +1 bit (sign bit)).

A cumulative adder 6 receives, at input terminals $B_0$ to $B_{23}$ thereof, 24-bit data obtained by extension by one bit of the most significant bit of 23-bit data (product) outputted from the multiplier 4, and further receives, at input terminals $A_0$ to $A_{23}$ thereof, 24-bit data stored in and outputted from an accumulator (ACC) 7. The cumulative adder 6 thus adds the two 24-bit input data and outputs a result of the addition from output terminals $\Sigma_0$ to $\Sigma_{23}$ thereof.

The shifter 8 connects the output terminals $\Sigma_0$ to $\Sigma_{23}$ of the cumulative adder 6 to input terminals $D_0$ to $D_{23}$ of the accumulator 7, respectively, when the exponent part difference of a coefficient corresponding to the mantissa part read out from the coefficient memory 5 is 0. On the other hand, when the exponent part difference of the coefficient corresponding to the mantissa part read out from the coefficient memory 5 is 1, the shifter 8 connects the output terminals $\Sigma_1$ to $\Sigma_{23}$ of the cumulative adder 6 to the input terminals $D_0$ to $D_{22}$ of the accumulator 7, respectively, and connects the output terminal $\Sigma_{23}$ of the cumulative adder 6 to the input terminal $D_{23}$ of the accumulator 7. Accordingly, the outputs of the cumulative adder 6 are shifted down by one bit when they are supplied to the accumulator 7.

The accumulator 7 receives a clock signal of the period of 2/CK at a clock terminal CLK thereof and temporarily stores therein 24-bit data outputted from the cumulative adder 6 by way of the shifter 8 at the timing of the clock signal. Further, the accumulator 7 receives a clear signal of the period of 1/fs at a clear terminal CLR thereof and resets, at the timing of the clear signal, the stored contents thereof to zero.

The switch 14 is switched in the period of 1/fs and alternately outputs data read out from the data memory 1 and data stored in the accumulator 9 to an output flip-flop (FF) 9. The output flip-flop 9 latches therein data read out from the data memory or data received from the accumulator 7 by way of the switch 14 and supplies the latched data, for example, to a digital to analog converter or some other circuit not shown.

The down counter 10 receives a load signal of the period of 1/fs and sets a predetermined initial value, for example, 14H (the suffix H denotes a hexadecimal value), thereto at the timing of the load signal. Then, each time a clock signal of the period of 1/CK is supplied to a clock terminal CLK of the down counter 10, the down counter 10 decrements its count value until 0H is reached, and the count value of the down counter 10 is supplied to an exclusive OR (XOR) circuit 11. Further, the upper four bits of the count value of the down counter 10 are supplied to an address terminal AD of the coefficient memory 5.

The exclusive OR circuit 11 includes four exclusive OR gates. The upper four bits of the count value of the down counter 10 are inputted to first input terminals of the exclusive OR circuits while the least significant bit of the count value of the down counter 10 is inputted commonly to the other or second input terminals of the exclusive OR circuits. When the least significant bit of the count value of the down counter 10 inputted to the second input terminals of the exclusive OR circuit 11 is 0, the exclusive OR circuit 11 outputs the upper four bits of the count value of the down counter 10 inputted to the first input terminals of the exclusive OR circuit 11 as they are without modifying them. On the other hand, when the least significant bit of the count value inputted to the second input terminal terminals of the exclusive OR circuit 11 is 1, the exclusive OR circuit 11 inverts the upper four bits of the count value inputted to the first input terminals thereof and outputs the inverted bits therefrom. The exclusive OR circuit 11 then adds, to the bit train of the four bits thus obtained, the least significant bit of the count value outputted from the down counter 10 as the most significant bit to the bit train and supplies the thus obtained bit train of 5 bits to an input terminal B of an adder 13.

A base counter 12 receives a clock signal of the period of 1/fs at a clock terminal CLK thereof and increments its count value at the timing of the clock signal. The adder 13 adds a count value outputted from the base counter 12 and a value outputted from the exclusive OR circuit 11 and outputs the thus obtained sum value to the address terminal AD of the data memory 1.

Figure 5:
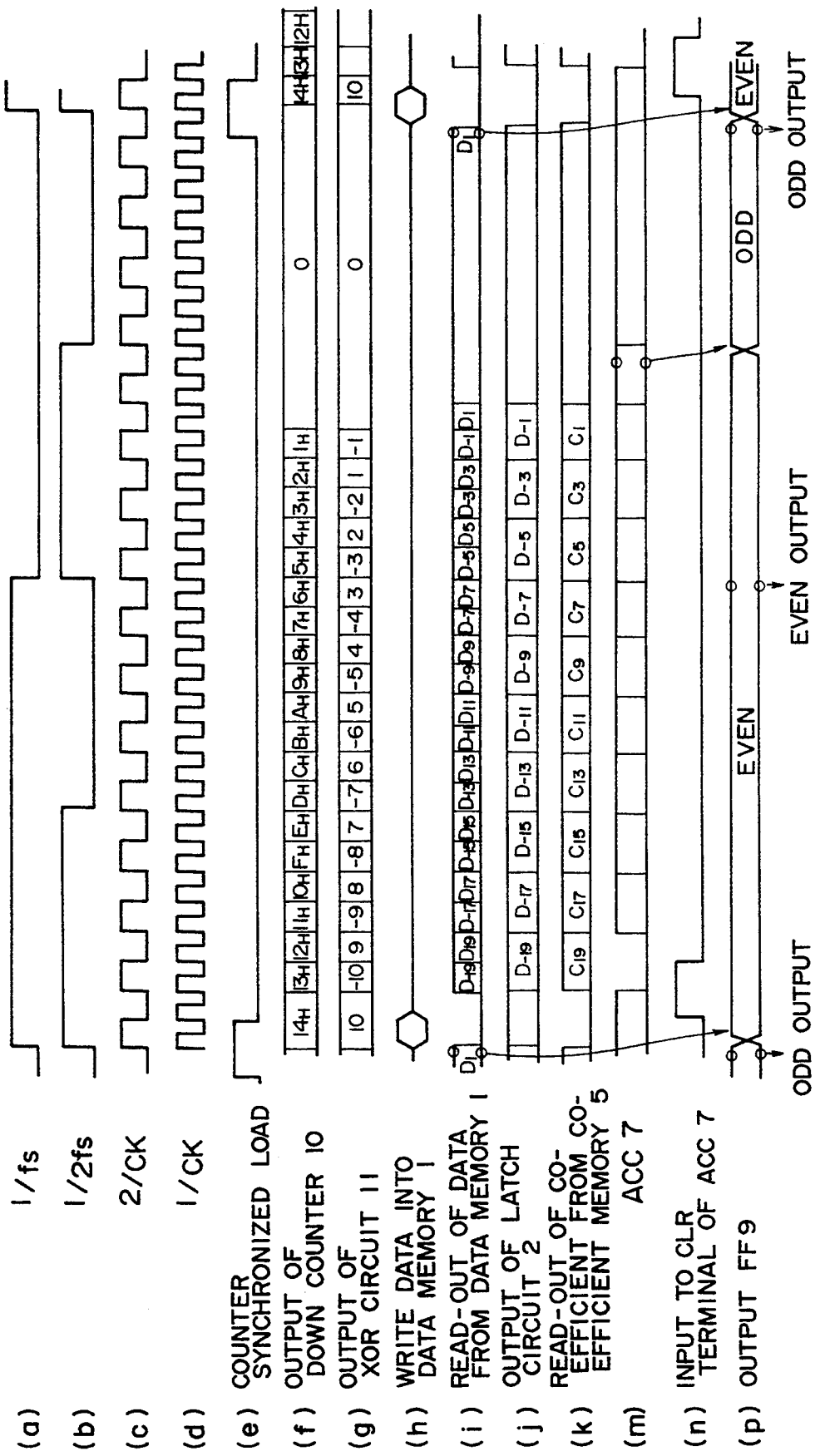
FIG. 5 is a time chart illustrating operation of the low-pass filter of FIG. 1.

Referring now to FIG. 5, in operation, sampling is performed at the sampling frequency of fs at the data memory 1 so that input digital data supplied for each period of 1/fs (refer to the curve (a) in FIG. 5) is successively stored or written into the data memory 1 starting at address 0 (refer to the curve (h) of FIG. 5).

Here, generally one frame of data includes the (order number n of the digital filter+1) samples of data $D_{-n}$, $D_{-(n-1)}$, ..., $D_{-1}$, $D_0$, $D_1$, ..., $D_{n-1}$ and $D_n$. However, in the present digital low-pass filter, since it is a digital filter of the interpolation type, one frame of data includes the number of data equal to the number of filter coefficients of odd-numbered order (FIG. 2), that is, a total of 20 sample data $D_{-19}$, $D_{-17}$, $D_{-15}$, $D_{-13}$, $D_{-11}$, $D_{-9}$, $D_{-7}$, $D_{-5}$, $D_{-3}$, $D_{-1}$, $D_1$, $D_3$, $D_5$, $D_7$, $D_9$, $D_{11}$, $D_{13}$, $D_{15}$ and $D_{19}$.

The count value of the base counter 12 is incremented at each timing at which data of one frame are stored into the data memory 1, that is, in the period of 1/fs. Since the count value of the base counter 12 is initially set so that it may be equal to an address of the data memory 1 to which data $D_1$ is to be stored, it always indicates an address of the data memory 1 to which data $D_1$ is to be successively stored.

On the other hand, when a load (counter synchronized load) signal of the period of 1/fs is inputted to the down counter 10 (refer to the curve (e) of FIG. 5), the down counter 10 is set to its initial value of 14H ("00010100" in binary value). Then, the count value of the down counter 10 is decremented at each timing at which a clock signal of the frequency CK, which is equal to a multiple of the frequency of fs at least by the number of data of one frame, for example, equal to 32 times the frequency of fs, and accordingly of the period of 1/CK, is supplied (refer to the curve (d) of FIG. 5) until the count value is reduced to 0H ("00000000" in binary value) (refer to the curve (f) in FIG. 5). The count value of the down counter 10 is supplied to the exclusive OR circuit 11. The exclusive OR circuit 11 converts, when the least significant bit of the count value outputted from the down counter 10 is 0, the 5-bit count value outputted from the down counter 10 into a bit train wherein the least significant bit of the count value is substituted into the most significant bit. On the other hand, when the least significant bit of the count value outputted from the down counter 10 is 1, the exclusive OR circuit 11 inverts the upper four bits of the count value of the down counter 10 and adds the least significant bit of the count value of the down counter 10 as the most significant bit to the bit train of the four bits to obtain a bit train of 5 bits. The exclusive OR circuit 11 outputs the bit train of 5 bits thus obtained to the input terminal B of the adder 13 (refer to the curve (g) of FIG. 5).

FIG. 4 illustrates the relationship between the count value outputted from the down counter 10 and the bit train outputted from the exclusive OR circuit 11. When the count value is 14H, that is, $00010100_2$ (the subscript 2 denotes a binary value), the least significant bit of the count value is 1, and accordingly, the output of the exclusive OR circuit 11 is, replacing the least significant bit of the count value into the most significant bit, the bit train of $00001010_2$, that is, 10 in decimal notation. When the count value is 13H, that is, $00010011_2$, since the least significant bit of the count value is 1, the output of the exclusive OR circuit 11 is, inverting the upper four bits of the count value ($00010012 \rightarrow 00001102$) and adding the least significant bit of 12 of the count value as the most significant bit to the bit train, the bit train of $00010110_2$, that is, $-10$. The values shown in FIG. 4 are successively outputted in a similar manner from the exclusive OR circuit 11.

It can be seen from FIG. 4 that the values successively outputted from the exclusive OR circuit 11 are offset values of the addresses of the data $D_{-19}$ to $D_{19}$ ($D_{-19}$, $D_{-17}$, $D_{-15}$, $D_{-13}$, $D_{-11}$, $D_{-9}$, $D_{-7}$, $D_{-5}$, $D_{-3}$, $D_{-1}$, $D_1$, $D_3$, $D_5$, $D_7$, $D_9$, $D_{11}$, $D_{13}$, $D_{15}$, $D_{17}$ and $D_{19}$) stored in the data memory 1 with reference to the address of the data memory 1 in which data $D_1$ is stored.

The adder 13 adds an address of the data memory 1 which is outputted from the base counter 12 and in which the data $D_1$ is stored and an offset address outputted from the exclusive OR circuit 11, and outputs the sum thus obtained to the address terminal AD of the data memory 1. The data $D_n$ stored at the address of the data memory 1 supplied from the adder 13 is read out from the data memory 1 and supplied to the latch circuit 2, the adder 3 and the switch 14. Accordingly, data are successively read out from the data memory 1 in the period of 1/CK, in which an address is outputted from the adder 13, starting at data which is multiplied at the multiplier 4 by a coefficients $C_n$ having a highest order number, that is, a coefficient having a comparatively low absolute value. Thus, data are read out in the order of $D_{-19}$, $D_{19}$, $D_{-17}$, $D_{17}$, $D_{-15}$, $D_{15}$, $D_{-13}$, $D_{13}$, $D_{-11}$, $D_{11}$, $D_{-9}$, $D_9$, $D_{-7}$, $D_7$, $D_{-5}$, $D_5$, $D_{-3}$, $D_3$, $D_{-1}$ and $D_1$ ( refer to the curve (i) in FIG. 5).

Of the data $D-19$, $D_{19}$, $D_{-17}$, $D_{17}$, $D_{-15}$, $D_{15}$, $D_{-13}$, $D_{13}$, $D_{-11}$, $D_{11}$, $D_{-9}$, $D_9$, $D_{-7}$, $D_7$, $D_{-5}$, $D_5$, $D_{-3}$, $D_3$, $D_{-1}$ and $D_1$ read out in this order from the data memory 1 in the period of 1/CK in this manner, the data $D_{-19}$, $D_{-17}$, $D_{-15}$, $D_{-13}$, $D_{-11}$, $D_{-9}$, $D_{-7}$, $D_{-5}$, $D_{-3}$ and $D_{-1}$ are successively latched by the latch circuit 2 (refer to the curve (j) of FIG. 5) at the timing at which the clock signal (curve (c) of FIG. 5) of the period of 2/CK is inputted to the clock terminal CLK of the latch circuit 2. Data is thus latched for each period of 2/CK by the latch circuit 2 and then supplied to the adder 3. Meanwhile, data is read out from the data memory 1 for each period of 1/CK and supplied to the adder 3 similarly.

Accordingly, at the adder 3, the data $D_{-19}$ to $D_{-1}$ successively latched by the latch circuit 2 in the period of 2/CK (i.e., $D_{-19}$, $D_{-17}$, $D_{-15}$, $D_{-13}$, $D_{-11}$, $D_{-9}$, $D_{-7}$, $D_{-5}$, $D_{-3}$ and $D_{-1}$) and, of the data $D_{-19}$, $D_{19}$, $D_{-17}$, $D_{17}$, $D_{-15}$, $D_{15}$, $D_{-13}$, $D_{13}$, $D_{-11}$, $D_{11}$, $D_{-9}$, $D_9$, $D_{-7}$, $D_7$, $D_{-5}$, $D_5$, $D_{-3}$, $D_3$, $D_{-1}$ and $D_1$ read out from the data memory 1 in the period of 1/CK, those data $D_{19}$, $D_{17}$, $D_{15}$, $D_{13}$, $D_{11}$, $D_9$, $D_7$, $D_5$, $D_3$ and $D_1$ which have not been latched by the latch circuit 2 are added, respectively. The sum data thus obtained, that is, data $D_{-19}+D_{19}$, $D_{-17}+D_{17}$, $D_{-15}+D_{15}$, $D_{-13}+D_{13}$, $D_{-11}+D_{11}$, $D_{-9}+D_9$, $D_{-7}+D_7$, $D_{-5}+D_5$, $D_{-3}+D_3$ and $D_{-1}+D_1$, are successively outputted to the multiplier 4 at the timing at which data $D_n$ is latched by the latch circuit 2, that is, in the period of 2/CK.

Meanwhile, from the coefficient memory 5, a coefficient stored at an address corresponding to the upper four bits of the count value outputted from the down counter 10 is read Out and outputted to the multiplier 4.

Here, the upper four bits of the count value supplied from the down counter 18 repetitively appear twice except the upper 4 bits of the initial value of $00010101_2$ (14H) as seen from FIG. 4. Since the count value of the down counter 10 is decremented by one for each period of 1/CK as described hereinabove, the upper four bits of the count value are decremented by one from 9 for each period of 2/CK except when it is equal to the initial value of $00001010_2$, that is, 10 in decimal notation. In the present digital low-pass filter, since data is written into the data memory 1 when the count value of the down counter 10 assumes its initial value of $00010101_2$ (refer to the curve (h) of FIG. 5), thereafter the mantissa parts of the coefficients $C_{19}$ to $C_1$ stored at addresses corresponding to the count value of the down counter 10, which is successively decremented from 9 to 0, are successively read out in the period of 2/CK from the coefficient memory 5 and supplied to the multiplexer 4.

Accordingly, the mantissa parts of the coefficients which are stored in the coefficient memory 5 and adjusted so that each exponent part difference may be equal to either 0 or 1 are read out successively in reverse order of magnitude of the exponent parts (FIG. 3). In other words, the mantissa parts of the coefficients stored in the coefficient memory 5 are read out in such a order that the decimal point position is not changed or is shifted rightwardly by one column.

As described so far, the sum data $D_{-19}+D_{19}$, $D_{-17}+D_{17}$, $D_{-15}+D_{15}$, $D_{-13}+D_{13}$, $D_{-11}+D_{11}$, $D_{-9}+D_9$, $D_{-7}+D_7$, $D_{-5}+D_5$, $D_{-3}+D_3$ and $D_{-1}+D_{-1}$ are successively outputted in the period of 2/CK from the adder 3 to the multiplier 4, and the mantissa parts of the coefficients $C_{19}$ to $C_1$ stored in addresses corresponding to the count value of the down counter 10, which is successively decremented from 9 to 0, are successively supplied in the period of 2/CK from the coefficient memory 5 to the multiplier 4. The multiplier 4 successively calculates in the period of 2/CK the product of the data $D_{-19}+D_{19}$ and the mantissa part of the coefficient $C_{19}$, the product of the data $D_{-17}+D_{17}$ and the mantissa part of the coefficient $C_{17}$, the product of the data $D_{-15}+D_{15}$ and the mantissa part of the coefficient $C_{15}$, the product of the data $D_{-13}+D_{13}$ and the mantissa part of the coefficient $C_{13}$, the product of the data $D_{-11}+D_{11}$ and the mantissa part of the coefficient $C_{11}$, the product of the data $D_{-9}+D_9$ and the mantissa part of the coefficient $C_9$, the product of the data $D_{-7}+D_7$ and the mantissa part of the coefficient $C_7$, the product of the data $D_{-5}+D_5$ and the mantissa part of the coefficient $C_5$, the product of the data $D_{-3}+D_3$ and the mantissa part of the coefficient $C_3$, and the product of the data $D_{-1}+D_1$ and the mantissa part of the coefficient $C_1$. The products thus calculated are successively outputted to the cumulative adder 6.

The cumulative adder 6 adds a product outputted from the multiplier 4 and a value outputted from the accumulator 7 so that the products successively outputted from the multiplier 4 are added cumulatively, and the cumulative sum is outputted from the cumulative adder 6 to the shifter 8. When the exponent part difference (FIG. 3) corresponding to the mantissa part of a coefficient supplied from the coefficient memory 5 to the multiplier 4 is 0, the sum value outputted from the cumulative adder 6 is supplied as it is by way of the shifter 8 to the accumulator 7 (refer to the curve (m) of FIG. 5). On the other hand, when the exponent part difference (FIG. 3) corresponding to the mantissa part of the coefficient supplied from the coefficient memory 5 to the multiplier 4 is 1, the sum value outputted from the cumulative adder 6 is shifted down by one bit by the shifter 8 and then supplied to the accumulator 7 (refer to the curve (m) of FIG. 5).

Here, the mantissa parts of the coefficients which are stored in the coefficient memory 5 and adjusted so that the exponent part differences thereof may be equal to either 0 or 1 are read out successively in reverse order of magnitude of the exponent parts described hereinabove (FIG. 3). In other words, the mantissa parts of the coefficients stored in the coefficient memory 5 are read out in such a order that the decimal point position is not changed or is shifted rightwardly by one column. Accordingly, when the exponent part difference (FIG. 3) corresponding to the mantissa part of a coefficient supplied currently from the coefficient memory 5 to the multiplier 4 is 0, the decimal point position of the mantissa part of the coefficient and the decimal point position of the mantissa part of a coefficient for which the product of an output value of the adder 3 is to be subsequently calculated by the multiplier 4 are equal to each other, and accordingly, bit shifting for the adjustment in column between the mantissa parts of the two coefficients is not performed by the shifter 8.

On the other hand, when the exponent part difference (FIG. 3) corresponding to the mantissa part of the coefficient supplied currently from the coefficient memory 5 to the multiplier 4 is 1, the decimal point position of the mantissa part of the coefficient is at a position higher by one column distance (a position shifted leftwardly by one column distance) than the decimal point position of the mantissa part of a coefficient for which the product of an output value of the adder 3 is to be subsequently calculated by the multiplier 4, and accordingly, bit shifting for the adjustment in column between the two values is performed by the shifter 8. In particular, the value obtained by cumulative addition by the cumulative adder 6 of the product calculated by the multiplier 4 between the exponent part of the coefficient currently read out from the coefficient memory 5 and the output of the adder 3 is shifted rightwardly by one column distance (shifted down by one bit).

A value outputted from the shifter 8 is latched in the period of 2/CK by the accumulator 7 and outputted to the cumulative adder 6 and the switch 14.

In this manner, a value outputted from the cumulative adder 6 by way of the shifter 8 is latched in the period of 2/CK by the accumulator 7, and the thus latched value is outputted to the cumulative adder 6. Meanwhile, the products calculated by the multiplier 4, that is, the product of the data $D_{-19}+D_{19}$ and the mantissa part of the coefficient $C_{19}$, the product of the data $D_{-17}+D_{17}$ and the mantissa part of the coefficient $C_{17}$, the product of the data $D_{-15}+D_{15}$ and the mantissa part of the coefficient $C_{15}$, the product of the data $D_{-13}+D_{13}$ and the mantissa part of the coefficient $C_{13}$, the product of the data $D_{-11}+D_{11}$ and the mantissa part of the coefficient $C_{11}$, the product of the data $D_{-9}+D_9$ and the mantissa part of the coefficient $C_9$, the product of the data $D_{-7}+D_7$ and the mantissa part of the coefficient $C_7$, the product of the data $D_{-5}+D_5$ and the mantissa part of the coefficient $C_5$, the product of the data $D_{-3}+D_3$ and the mantissa part of the coefficient $C_3$, and the product of the data $D_{-1}+D_1$ and the mantissa part of the coefficient $C_1$, are successively outputted in the period of 2/CK to the cumulative adder 6.

Accordingly, at the cumulative adder 6, the product of the data $D_{-19}+D_{19}$ and the mantissa part of the coefficient $C_{19}$, the product of the data $D_{-17}+D_{17}$ and the mantissa part of the coefficient $C_{17}$, the product of the data $D_{-15}+D_{15}$ and the mantissa part of the coefficient $C_{15}$, the product of the data $D_{-13}+D_{13}$ and the mantissa part of the coefficient $C_{13}$, the product of the data $D_{-11}+D_{11}$ and the mantissa part of the coefficient $C_{11}$, the product of the data $D_{-9}+D_9$ and the mantissa part of the coefficient $C_9$, the product of the data $D_{-7}+D_7$ and the mantissa part of the coefficient $C_7$, the product of the data $D_{-5}+D_5$ and the mantissa part of the coefficient $C_5$, the product of the data $D_{-3}+D_3$ and the mantissa part of the coefficient $C_3$, and the product of the data $D_{-1}+D_1$ and the mantissa part of the coefficient $C_1$, which are successively outputted in the period of 2/CK from the multiplier 4, are successively added while they are adjusted in column thereof by the shifter 8. Consequently, a sum total of all of the products of the data $D_{-19}+D_{19}$ and the mantissa part of the coefficient $C_{19}$, the product of the data $D_{-17}+D_{17}$ and the mantissa part of the coefficient $C_{17}$, the product of the data $D_{-15}+D_{15}$ and the mantissa part of the coefficient $C_{15}$, the product of the data $D_{-13}+D_{13}$ and the mantissa part of the coefficient $C_{13}$, the product of the data $D_{-11}+D_{11}$ and the mantissa part of the coefficient $C_{11}$, the product of the data $D_{-9}+D_9$ and the mantissa part of the coefficient $C_9$, the product of the data $D_{-7}+D_7$ and the mantissa part of the coefficient $C_7$, the product of the data $D_{-5}+D_5$ and the mantissa part of the coefficient $C_5$, the product of the data $D_{-3}+D_3$ and the mantissa part of the coefficient $C_3$, and the product of the data $D_{-1}+D_1$ and the mantissa part of the coefficient $C_1$, that is, a sum of products of the data $D_{-19}$ to $D_{19}$ (data $D_{-1}+D_1$ to $D_{-19}+D_{19}$) and the coefficients $C_1$ to $C_{19}$, respectively, is finally latched in the accumulator 7 (refer to the curve (m) in FIG. 5).

A cumulative sum value latched in the accumulator 7 and data $D_1$ supplied from the data memory 1 are alternately selected by the switch 14, which is switched in the period of 2/fs, and supplied to the output flip-flop 9. Thus, the cumulative sum value latched in the accumulator 7 is latched as an output of an odd-numbered sample (ODD) of the digital low-pass filter by the output flip-flop 9, and the data $D_1$ supplied from the data memory 1 is latched as an output of an even-numbered sample (EVEN) of the digital low-pass filter (refer to the curves (i) and (p) of FIG. 5, respectively). The output of the digital low-pass filter is supplied to a digital to analog (D/A) converter or the like connected to it.

As described so far, in the present digital low-pass filter, coefficients are stored separately for the mantissa parts and the exponent part differences and calculation of a sum of products is performed in reverse order of magnitude of the exponent parts while bit shifting (shifting down) of an interim result of the calculation of a sum of products is performed in accordance with the exponent part difference. Consequently, the bit length (range) which the apparatus can handle is utilized effectively and calculation of a sum of products can be performed with a high degree of accuracy.

It is to be noted that, the latched contents of the accumulator 7 are reset in response to a reset signal supplied to it in the period of 1/fs (refer to the curve (n) in FIG. 5).

While, in the digital low-pass filter described above, the exponent part difference of a coefficient $C_{2q+1}$ stored in the coefficient memory 5 is defined as a difference between the exponent part of the coefficient $C_{2q+1}$ and the exponent part of the coefficient $C_{2q-1}$ (FIG. 3), the exponent part difference of the coefficient $C_{2q-1}$ stored in the coefficient memory 5 can be defined as the difference between the exponent part of the coefficient $C_{2q+1}$ and the exponent part of the coefficient $C_{2q-1}$ if the shifter 8 for adjustment in column, which is interposed between the output terminals $\Sigma_0$ to $\Sigma_{23}$ of the cumulative adder 6 and the input terminals $D_0$ to $D_{23}$ of the accumulator 7 in the digital low-pass filter described above, is interposed otherwise between the output-terminals $Q_0$ to $Q_{23}$ of the accumulator 7 and the input terminals $A_0$ to $A_{23}$ of the cumulative adder 6 (refer to FIG. 6).

Further, in the case of such a coefficient of a popular digital filter of the FIR type wherein the maximum point increases while the exponent part increases and decreases as shown in FIG. 7, calculation of a sum of products which minimizes the influence of the round-off error by adjusting the exponent parts of the coefficients so that the exponent parts of the coefficients except the coefficient which has the greatest exponent part increase monotonously toward the maximum exponent part (in FIG. 7, the exponent part of the coefficient $C_1$) and the exponent part differences may be equal to either 0 or 1.

Further, in this instance, a sum of products can be calculated with a higher degree of accuracy than that of the case of FIG. 7 by generating an address of a coefficient stored in the coefficient memory 5, for example, by a program so that calculation of a sum of products may proceed in reverse order of exponent parts as seen in FIG. 8.

In the present digital low-pass filter, when a coefficient for which calculation of a sum of products is to be performed is, for example, 81.5, if the coefficient of 81.5 is represented in the floating point form having an 8-bit mantissa part, then the result is $$01010012 \times 2^0 \text{ (81)}$$

and accordingly, the accuracy is deteriorated. However, if the coefficient of 81.5 is represented in the developed (divided) values of 82/2 and 81/2 and 81/2 (82/2+81/2=81.5), then are given as $$0101001 0_2 \times 2^{-1} \text{ (=82/2)}$$

and $$0101000 1_2 \times 2^{-1} \text{ (=81/2)}$$

Accordingly, the 8-bit mantissa part can be represented in the floating point form without deteriorating the accuracy. Accordingly, calculation of a sum of products can be performed without deteriorating the accuracy by developing a coefficient and storing the developed coefficient into the coefficient memory 5 in this manner.

It is to be noted that, while, in the digital low-pass filter described above, the exponent part difference assumes either 0 or 1 if the number of bits with which an exponent part difference can be stored is increased in the coefficient memory 5 and the shifter 8 is replaced by another shifter which can shift down an exponent part difference within the number of bits, then calculation of a sum of products with a high degree of accuracy can be performed for an arbitrary exponent part difference.

Figure 9:
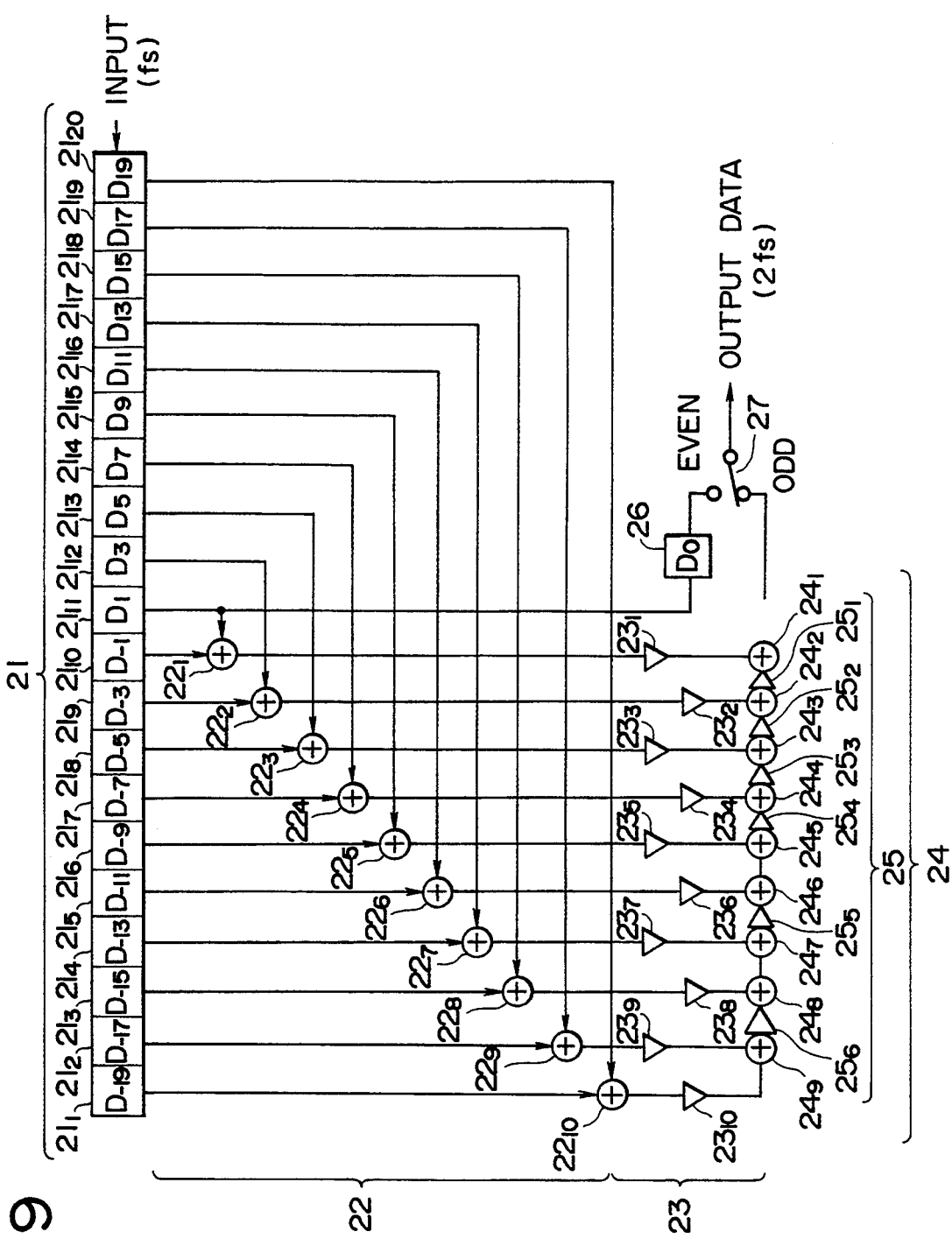
FIG. 9 is a block diagram of another digital low-pass filter to which an apparatus for calculating a sum of products according to the present invention is applied showing another preferred embodiment of the present invention.

Referring now to FIG. 9, there is shown another digital low-pass filter to which an apparatus for calculating a sum of products according to the present invention is applied. The present digital low-pass filter is a digital filter of the interpolation type of order 39 which can twofold oversample an input digital signal to produce a filter output, similarly as in the digital low-pass filter described hereinabove with reference to FIG. 1. Also the digital low-pass filter is designed so that the impulse response thereof presents such a waveform as shown in FIG. 2. The coefficients of the present low-pass filter are symmetrical with respect to the coefficient $C_0$ of order 0, and the coefficients $C_2$, $C_4$, $C_6$, $C_8$, $C_{10}$, $C_{12}$, $C_{14}$, $C_{16}$ and $C_{18}$ of even-numbered order except the coefficient $C_0 (=1)$ of order 0 are all equal to zero.

Each of registers $21_1$ to $21_{20}$ of a register section 21 latches, in the period of 1/fs, time series data sampled at the sampling period of fs and inputted from the register $21_{20}$ and outputs the latched data successively to a leftside one of the registers $21_1$ to $21_{20}$. Adders $22_1$ to $22_{10}$ of an adding section 22 add data $D_{-1}$ and $D_1$, data $D_{-3}$ and $D_3$, data $D_{-5}$ and $D_5$, data $D_{-7}$ and $D_7$, data $D_{-9}$ and $D_9$, data $D_{-11}$ and $D_{11}$, data $D_{-13}$ and $D_{13}$, data $D_{-15}$ and $D_{15}$, data $D_{-17}$ and $D_{17}$, and data $D_{-19}$ and $D_{19}$ latched in the register section 21, respectively.

Multipliers $23_1$ to $23_{10}$ of a multiplying section 23 multiply values outputted from the adders $22_1$ to $22_{10}$ by the mantissa parts of coefficients same as those of the digital low-pass filter described hereinabove with reference to FIG. 1, that is, by the mantissa parts (FIG. 3) of the coefficients $C_1$ to $C_{19}$, respectively.

Shifters $25_1$ to $25_6$ of a shifter section 25 shift down values outputted from adders $24_2$ to $24_5$, $24_7$ and $24_9$, respectively, of an adder section 24 by one bit.

The adder $24_9$ of the adding section 24 calculates a sum of the output of the multiplier $23_{10}$ and the output of the multiplier $23_9$. An adder $24_8$ of the adding section 24 calculates a sum of the output of the shifter $25_6$ and the multiplier $23_8$. The adder $24_7$ of the adding section 24 calculates a sum of the output of the adder $24_8$ and the output of the multiplier $23_7$. An adder $24_6$ of the adding section 24 calculates a sum of the output of the shifter $25_5$ and the output of the multiplier $23_6$. The adder $24_5$ of the adding section 24 calculates a sum of the output of the adder $24_6$ and the output of the multiplier $23_5$. The adder $24_4$ of the adding section 24 calculates a sum of the output of the shifter $25_4$ and the output of the multiplier $23_4$. The adder $24_3$ of the adding section 24 calculates a sum of the output of the shifter $25_3$ and the output of the multiplier $23_3$. The adder $24_2$ of the adding section 24 calculates a sum of the output of the shifter $25_2$ and the output of the multiplier $23_2$. The adder $24_1$ of the adding section 24 calculates a sum of the output of the shifter $25_1$ and the output of the multiplier $23_1$.

A register 26 latches data, which is latched in the period of 1/fs by the register $21_{11}$, in the period of ½fs equal to one half the period of 1/fs.

In the digital low-pass filter of FIG. 9, an odd-numbered sample (ODD) of the filter output obtained by twofold oversampling is given as a sum of the products of input data and the coefficients $C_1$ to $C_{19}$ having odd-numbered suffixes, but an even-numbered sample (EVEN) is given as the product of the coefficient $C_0$ and input data because the coefficients $C_2$, $C_4$, $C_6$, $C_8$, $C_{10}$, $C_{12}$, $C_{14}$, $C_{16}$ and $C_{18}$ are all equal to 0. Since the coefficient $C_0$ is 1, the even-number sample is input data (data $D_0$) itself for which the product of the coefficient $C_0$ is to be calculated. Further, since data inputted in the period of fs is twofold oversampled, if it is assumed imaginarily that data obtained by interpolation to the input data is inputted in the period of ½fs, then when an odd-numbered sample of the filter output is outputted, data $D_1$ for which the product of the coefficient $C_1$ is calculated corresponds to the data $D_0$ after lapse of the time of ½fs.

Consequently, if data $D_1$ latched in the period of 1/fs by the register $21_{11}$ is latched in the period of ½fs by the register 26, then a twofold sampled even-numbered sample of the filter output is obtained.

The switch 27 is switched in the period of ½fs and alternately supplies the outputs of the data $D_0$ latched by the register 26 (or the data $D_1$ after lapse of the time of ½fs) and the adder $24_1$, for example, to a digital to analog converter connected to the digital low-pass filter.

In operation, data $D_{-1}$ and $D_1$, data $D_{-3}$ and $D_3$, data $D_{-5}$ and $D_5$, data $D_{-7}$ and $D_7$, data $D_{-9}$ and $D_9$, data $D_{-11}$ and $D_{11}$, data $D_{-13}$ and $D_{13}$, data $D_{-15}$ and $D_{15}$, data $D_{-17}$ and $D_{17}$, and data $D_{-19}$ and $D_{19}$ latched in the period of 1/fs by the register section 21 are added by the adders $22_1$ to $22_{10}$, respectively. The thus obtained sum data $D_{-1}+D_1$, $D_{-3}+D_3$, $D_{-5}+D_5$, $D_{-7}+D_7$, $D_{-9}+D_9$, $D_{-11}+D_{11}$, $D_{-13}+D_{13}$, $D_{-15}+D_{15}$, $D_{-17}+D_{17}$ and $D_{-19}+D_{19}$ are supplied to the multipliers $23_1$ to $23_{10}$, respectively.

The multipliers $23_1$ to $23_{10}$ calculate the product of the data $D_{-1}+D_1$ and the mantissa part of the coefficient $C_1$, the data $D_{-3}+D_3$ and the mantissa part of the coefficient $C_3$, the data $D_{-5}+D_5$ and the mantissa part of the coefficient $C_5$, the data $D_{-7}+D_7$ and the mantissa part of the coefficient $C_7$, the data $D_{-9}+D_9$ and the mantissa part of the coefficient $C_9$, the data $D_{-11}+D_{11}$ and the mantissa part of the coefficient $C_{11}$, the data $D_{-13}+D_{13}$ and the mantissa part of the coefficient $C_{13}$, the data $D_{-15}+D_{15}$ and the mantissa part of the coefficient $C_{15}$, the data $D_{-17}+D_{17}$ and the mantissa part of the coefficient $C_{17}$, and the data $D_{-19}+D_{19}$ and the mantissa part of the coefficient $C_{19}$, respectively.

Here, the mantissa parts of the coefficients for which the products of data supplied from the adding section 22 are calculated by the multiplying section 23 are the same as those in the digital low-pass filter described hereinabove with reference to FIG. 1 (FIG. 3).

Since the exponent part difference of the coefficient $C_{19}$ having the mantissa part for which the product of the data $D_{-19}+D_{19}$ is calculated by the multiplier $23_{10}$ is 0, that is, the difference between the exponent part of the coefficient $C_{19}$ having the mantissa part for which the product of the data $D_{-19}+D_{19}$ is calculated by the multiplier $23_{10}$ and the exponent part of the coefficient $C_{17}$ having the mantissa part for which the product of the data $D_{-17}+D_{17}$ is calculated by the multiplier $23_9$ is 0 (FIG. 3), the product of the data $D_{-19}+D_{19}$ and the mantissa part of the coefficient $C_{19}$ calculated by the multiplier $23_{10}$ is supplied as it is to the adder $24_9$. Then at the adder $24_9$, a sum of the product of the data $D_{-19}+D_{19}$ and the mantissa part of the coefficient $C_{19}$ supplied from the multiplier $23_{10}$ and the product of the data $D_{-17}+D_{17}$ and the mantissa of the coefficient $C_{17}$ supplied from the multiplier $23_9$ is calculated, and the sum thus calculated is outputted to the shifter $25_6$.

Since the exponent part difference of the coefficient $C_{17}$ having the mantissa part for which the product of the data $D_{-17}+D_{17}$ is calculated by the multiplier $23_9$ is 1, that is, the difference between the exponent part of the coefficient $C_{17}$ having the mantissa part for which the product of the data $D_{-17}+D_{17}$ is calculated by the multiplier $23_9$ and the exponent part of the coefficient $C_{15}$ having the mantissa part for which the product of the data $D_{-15}+D_{15}$ is calculated by the multiplier $23_8$ is 1 (FIG. 3), the value outputted from the adder $24_9$ is shifted down by one bit and then supplied to the adder $24_8$. Then at the adder $24_8$, a sum of the output of the shifter $25_6$ and the output of the multiplier $23_8$ is calculated.

Since the exponent part difference of the coefficient $C_{15}$ having the mantissa part for which the product of the data $D_{-15}+D_{15}$ is calculated by the multiplier $23_8$ is 1 (FIG. 3), the output of the multiplier $23_8$ is supplied as it is to the adder $24_7$, and the sum of the output of the adder $24_8$ and the output of the multiplier $23_7$ is calculated by the adder $24_7$.

Similarly, the output of the adder $24_7$ is shifted down by one bit by the shifter $25_5$, and the sum of the output of the shifter $25_5$ and the output of the multiplier $23_6$ is calculated by the adder $24_6$; the sum of the output of the adder $24_6$ and the output of the multiplier $23_5$ is calculated by the adder $24_5$; the output of the adder $24_5$ is shifted down by one bit by the shifter $25_4$, and the sum of the output of the shifter $25_4$ and the multiplier $23_4$ is calculated by the adder $24_4$; the output of the adder $24_4$ is shifted down by one bit by the shifter $25_3$, and the sum of the output of the shifter $25_3$ and the output of the multiplier $23_3$ is calculated by the adder $24_3$; the output of the adder $24_3$ is shifted down by one bit by the shifter $25_2$, and the sum of the output of the shifter $25_2$ and the output of the multiplier $23_2$ is calculated by the adder $24_2$; and the output of the adder $24_2$ is shifted down by one bit by the shifter $25_1$, and the sum of the output of the shifter $25_1$ and the output of the multiplier $23_1$ is calculated by the adder $24_1$.

In this manner, a result of the calculation of a sum of products, which is an odd-numbered sample of the filter output, that is, $C_1(D_{-1} + D_1) + C_3(D_{-3} - D_3) + C_5(_{-5} + D_5) + C_7(D_{-7} + D_7) + C_9(D_{-9} + D_9) + C_{11}(D_{-11} + D_{11}) + C_{13}(D_{-13} + D_{13}) + C_{15}(D_{-15}) + C_{17}(D_{-17} + D_{17}) + C_{19}(D_{-19} + D_{19})$, is outputted from the adder $24_1$.

Further, data latched in the period of 1/fs by the register $21_{11}$ is latched in the period of ½fs by the register 26, and the value latched in the register 26 and the output of the adder $24_1$ are alternately selected by the switch 27. Consequently, a twofold oversampled filter output can be obtained.

Figure 10:
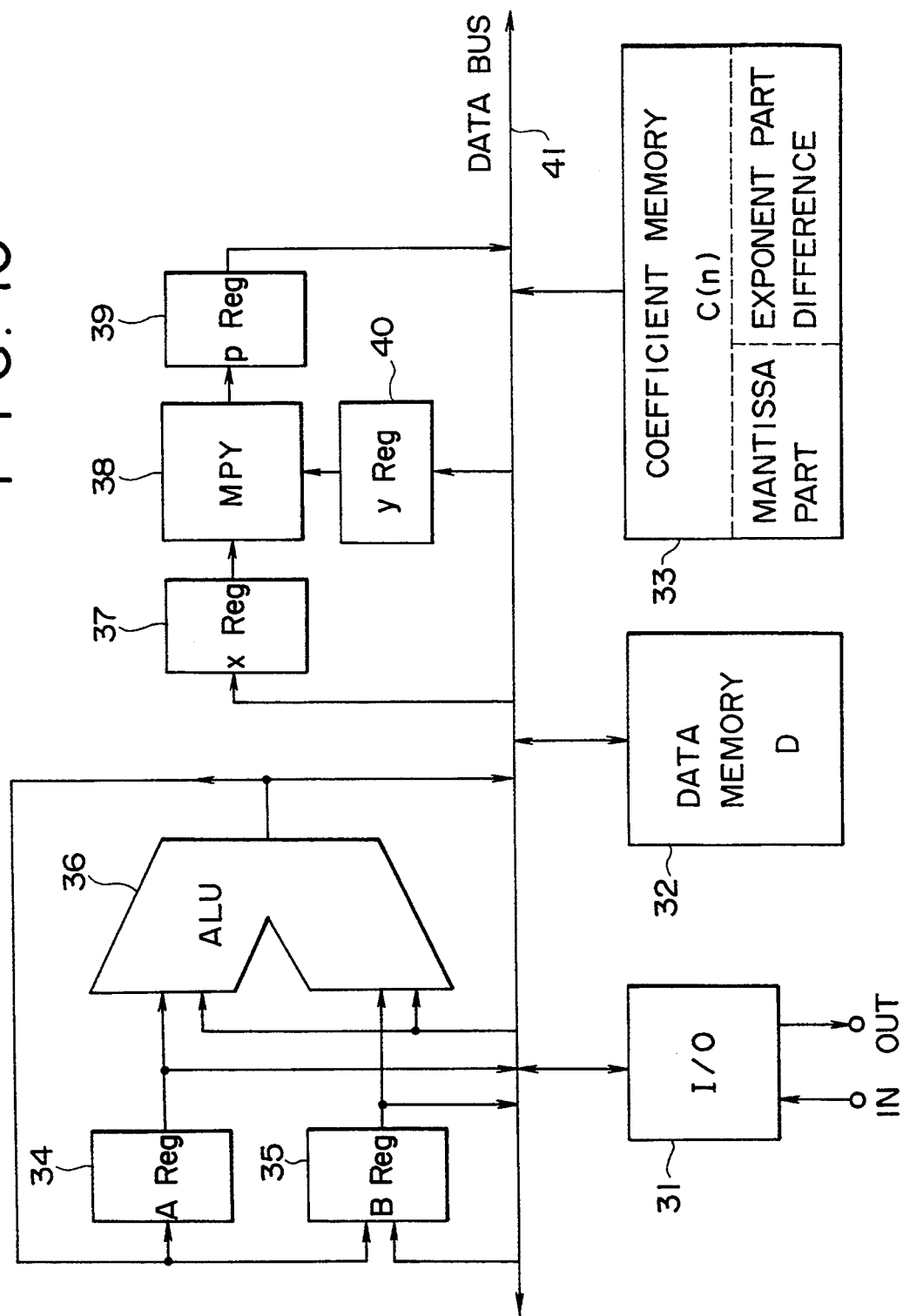
FIG. 10 is a block diagram of a further digital low-pass filter to which an apparatus for calculating a sum of products according to the present invention is applied showing a further preferred embodiment of the present invention.

Referring now to FIG. 10, there is shown a digital low-pass filter to which an apparatus for calculating a sum of products according to the present invention is applied. The present digital low-pass filter is a digital filter of the interpolation type of order 39 which can twofold oversample an input digital signal to produce a filter output, similarly as in the digital low-pass filters described hereinabove with reference to FIGS. 1 and 9. Also the present digital low-pass filter is designed so that the impulse response thereof presents such a waveform as shown in FIG. 2.

An interface (I/O) 31 controls inputs and outputs of data from and to the outside. A data memory 32 stores therein data $D_n$ received from the interface 31 by way of a data bus 41. A coefficient memory 33 has the mantissa parts and exponent part differences of the filter coefficients $C_n$ (FIG. 3) Similarly as in the digital low-pass filter of FIG. 1.

A register (AReg) 34 latches the output of an arithmetic and logic unit (ALU) 36. Another register (BReg) 35 latches data $D_n$ stored in the data memory 32. A further register (xReg) 37 latches latched data of the register 35 by way of the data bus 41. A still further register (yReg) 40 latches the mantissa part of a coefficient $C_n$ stored in the coefficient memory 33. A multiplier (MPY) 38 calculates the product of data latched in the register 37 and data latched in the register 38. A yet further register (pReg) 39 latches the product of latched data of the register 37 and latched data of the register 38 outputted from the multiplier 38.

The arithmetic and logic unit 36 executes addition and one-bit shifting of input data. Further, the arithmetic and logic unit 36 outputs 0 in order to initialize the registers 34, 35, 37, 39 and 40 to zero.

Referring now to FIG. 11, there is illustrated operation of the digital low-pass filter shown in FIG. 10. First at step S1, data for one frame, that is, $D_{-19}$, $D_{-17}$, $D_{-15}$, $D_{-13}$, $D_{-11}$, $D_{-9}$, $D_{-7}$, $D_{-5}$, $D_{-3}$, $D_{-1}$, $D_1$, $D_3$, $D_5$, $D_7$, $D_9$, $D_{11}$, $D_{13}$, $D_{15}$, $D_{17}$ and $D_{19}$, are fetched from the interface 31 and stored into the data memory 32 by way of the data bus 41. Further at step 1, the register 34 is cleared in response to "0" outputted from the arithmetic and logic unit 36, and the variable n which corresponds to the suffix to a filter coefficient is set to one half the order number of the digital low-pass filter, that is, 19 (n=19). Then, the control sequence advances to step S2.

At step S2, the data $D_{-n}$ is latched by the register 35. Then at step S3, the sum of the data $D_{-n}$ latched in the register 35 and the data $D_n$ stored in the data memory 32, that is, $D_{-n}+D_n$, is calculated by the arithmetic and logic unit 36, and the sum is latched by the register 35. Then at step S4, the data $D_{-n}+D_n$ latched in the register 35 is latched by the register 37 and the mantissa part of the coefficient $C_n$ stored in the coefficient memory 32 is latched by the register 40.

At step S5, the product of the data $D_{-n}+D_n$ latched in the register 37 and the mantissa part of the coefficient $C_n$ latched in the register 40, that is, the mantissa part of the coefficient $C_n \times (D_{-n}+D_n)$, is calculated by the multiplier 38 and latched by the register 39.

At step S6, the sum of the data (the mantissa part of the coefficient $C_n \times (D_{-n}+D_n)$) latched in the register 39 and the data latched in the register 34 is calculated by the arithmetic and logic unit 36 and then latched by the register 34 again. In other words, at step S6, a cumulative sum value, of the data (coefficient $C_n \times (D_{-n}+D_n)$) latched in the register 39 is latched by the register 34.

After the cumulative sum value of the data (coefficient $C_n \times (D_{-n}+D_n)$) latched in the register 39 is latched by the register 34 at step S6, it is judged at step S7 whether or not the exponent part difference (FIG. 3) of the coefficient $C_n$ having the mantissa part latched in the register 40 is equal to 1. If the exponent part difference (FIG. 3) of the coefficient $C_n$ having the mantissa part latched in the register 40 is not equal to 1, then the control sequence advances to step S9 skipping step S8.

On the other hand, if the exponent part difference (FIG. 3) of the coefficient $C_n$ having the mantissa part latched in the register 40 is equal to 1, then the control sequence advances to step S8, at which the cumulative sum value of the data (coefficient $C_n \times (D_{-n}+D_n)$ latched in the register 34 is multiplied by $\frac{1}{2}$, that is, the cumulative sum value of the data (coefficient $C_n \times (D_{-n}+D_n)$ latched in the register 34 is shifted down by one bit in order to effect adjustment in column with data to be cumulatively added subsequently at step S6, that is, the coefficient $(C_{n-2} \times (D_{-(n-2)}+D_{n-2}))$, whereafter the control sequence advances to step S9.

At step S9, the variable n is decremented by 2, and then at step S10, it is judged whether or not the variable n is in the negative. If it is judged that the variable is not in the negative, that is, when calculation of a sum of products of the data for one frame is not completed, the control sequence returns to step S2 so that the processing from step S2 to step S10 will thereafter be repeated until it is judged at step S10 that the variable n is in the negative.

When it is judged at step S10 that the variable is in the negative, that is, when calculation of a sum of products of the data for one frame is completed, the control sequence advances to step S11, at which either the data $D_1$ is supplied at an even-numbered sample (EVEN output) of the filter output or the cumulative sum value latched in the register 34 is supplied at an odd-numbered sample (ODD output) of the filter output to the interface 31.

It is to be noted that the flow chart of FIG. 11 relates to the filter output of data for one frame and the processing steps S1 to S11 described above are repeated until the data inputted to the interface 31 are all used up.

While several applications of the apparatus for calculating a sum of products according to the present invention to a digital low-pass filter are described so far, the apparatus for calculating a sum of products and the method of calculating a sum Of products according to the present invention can be applied to popular digital filters, digital equalizers, digital signal processors and so forth as well as to discrete cosine transform (DCT), fast Fourier transform (FFT) and so forth.

Having now fully described the invention, it will be apparent to one of ordinary skill in the art that many changes and modifications can be made thereto without departing from the spirit and scope of the invention as set forth herein.

What is claimed is:

1. An apparatus for calculating a sum of products, comprising:
   a first memory for storing data;
   a second memory for storing coefficients, the coefficients having exponent parts;
   a multiplier for calculating the products of the data stored in the first memory and the coefficients stored in the second memory in order of magnitude of the exponent parts of the coefficients;
   a cumulative adder coupled to the output of the multiplier for adding the calculated products of the multiplier; and
   bit shifting means for bit shifting the products cumulatively added by the cumulative adder in accordance with differences between the exponent parts of the coefficients stored in the second memory.

2. An apparatus for calculating a sum of products according to claim 1, wherein the order of magnitude is a reverse order of magnitude.

3. An apparatus for calculating a sum of products according to claim 2, further comprising coefficient read-out means for reading out the coefficients stored in the second memory in reverse order of magnitude of the exponent parts of the coefficients.

4. An apparatus for calculating a sum of products according to claim 3, further comprising data read-out means for reading out the data stored in the first memory in the order corresponding to the order in which the coefficients stored in the second memory are read out by said coefficient read-out means.

5. An apparatus for calculating a sum of products according to claim 1, wherein the multiplier calculates the products of the data stored in the first memory and the coefficients stored in the second memory in the order in which the exponent parts increase monotonously.

6. An apparatus for calculating a sum of products according to claim 5, wherein the multiplier calculates the products of the data stored in the first memory and the coefficients stored in the second memory in the order in which differences between adjacent ones of the exponent parts exhibit the value of either 0 or 1.

7. An apparatus for calculating a sum of products according to claim 5, wherein the multiplier develops the coefficients stored in the second memory into the form of sums having an arbitrary number of terms in accordance with the magnitudes of the exponent parts of the coefficients and calculates the products of the sums and the data stored in the first memory.

8. An apparatus for calculating a sum of products according to claim 1, wherein the second memory stores the differences between the exponent parts of the coefficients.

9. An apparatus for calculating a sum of products, comprising:
- at least one memory for storing data and coefficients, the coefficients having mantissa parts and exponent parts;
- a multiplier for calculating the products of the data and the mantissa parts;
- a cumulative adder for cumulatively adding the products calculated by the multiplier; and
- a bit shifter for bit shifting the products cumulatively added by the cumulative adder in accordance with differences between the exponent parts of the coefficients.

10. An apparatus for calculating a sum of products according to claim 9, wherein an output of the multiplier is coupled to a first input of the cumulative adder, further comprising an accumulator having an input and an output, the input of the accumulator coupled to an output of the bit shifter and the output of the accumulator coupled to a second input of the cumulative adder.

11. An apparatus for calculating a sum of products according to claim 10, further comprising a flip-flop circuit coupled to the output of the accumulator, the flip-flop circuit operative to generate output data.

12. A method of performing an operation on digital input data representative of a digital input signal to generate digital output data representative of a digital output signal, comprising the steps of:
- storing the input data;
- storing coefficients representative of the operation, the coefficients having mantissa parts and exponent parts;
- multiplying the input data and the mantissa parts;
- cumulatively adding the products of the input data and the mantissa parts;
- shifting the cumulatively added products in accordance with differences between exponent parts;
- accumulating the shifted cumulatively added products; and
- latching one of stored input data and shifted cumulatively added products to thereby provide output data representative of an output signal.

* * * * *

UNITED STATES PATENT AND TRADEMARK OFFICE
CERTIFICATE OF CORRECTION

PATENT NO. : 5,400,271
DATED : Mar. 21, 1995
INVENTOR(S) : Takuji Himeno

It is certified that error appears in the above-indentified patent and that said Letters Patent is hereby corrected as shown below:

In column 18, line 11, replace "Of" with --of--.

Signed and Sealed this

Sixth Day of June, 1995

Attest:

BRUCE LEHMAN

Attesting Officer

Commissioner of Patents and Trademarks